(12) United States Patent
Shabi et al.

(10) Patent No.: US 11,099,756 B2
(45) Date of Patent: Aug. 24, 2021

(54) MANAGING DATA BLOCK COMPRESSION IN A STORAGE SYSTEM

(71) Applicant: EMC IP HOLDING COMPANY LLC, Hopkinton, MA (US)

(72) Inventors: Uri Shabi, Tel Mond (IL); Amitai Alkalay, Kadima (IL)

(73) Assignee: EMC IP HOLDING COMPANY LLC, Hopkinton, MA (US)

(*) Notice: Subject to any disclaimer, the term of this patent is extended or adjusted under 35 U.S.C. 154(b) by 43 days.

(21) Appl. No.: 16/654,287

(22) Filed: Oct. 16, 2019

(65) Prior Publication Data

US 2021/0117084 A1    Apr. 22, 2021

(51) Int. Cl.
*G06F 12/00* (2006.01)
*G06F 3/06* (2006.01)
*H03M 7/30* (2006.01)

(52) U.S. Cl.
CPC ............ *G06F 3/064* (2013.01); *G06F 3/0602* (2013.01); *G06F 3/0673* (2013.01); *G06F 3/0683* (2013.01); *H03M 7/30* (2013.01)

(58) Field of Classification Search
CPC ...... G06F 3/064; G06F 3/0602; G06F 3/0641; G06F 3/0673; G06F 3/0683; G06F 12/0864; G06F 12/1018; G06F 17/22; G06F 17/30097; G06F 17/30109; G06F 17/30153; H03M 7/30
See application file for complete search history.

(56) References Cited

U.S. PATENT DOCUMENTS 9,419,648 B1 *   8/2016   Guilford .................. G06F 8/52

* cited by examiner

*Primary Examiner* — Shawn X Gu
(74) *Attorney, Agent, or Firm* — Daly, Crowley Mofford & Durkee, LLP

(57) ABSTRACT

An aspect of managing data block compression in a storage system includes performing, for each block written to the storage system: bit-wise traversing the block, searching the block for a pattern indicating a repeating sequence of bits and, upon determining the pattern exists in the block and the repeating sequence of bits in the pattern exceeds a threshold value, removing the repeating sequence of bits from the block thereby yielding a reduced-size block.

17 Claims, 5 Drawing Sheets

MANAGING DATA BLOCK COMPRESSION IN A STORAGE SYSTEM

BACKGROUND

Data optimization techniques reduce system administration and storage overhead costs. One optimization technique is compression in which a system re-encodes data in a form that uses fewer bits than the original data, which can increase storage, transmission speed, and processing efficiency. While data compression techniques save on storage space, it can involve overhead costs such as increases in input/output (IO) access overhead. In addition, there are many storage operations that operate on ingested blocks, such as hash calculations and compression/decompression that may benefit, in CPU cycles and or memory and/or interface bandwidth overhead, from block size reduction.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to aspects of the disclosure, a method for managing data block compression in a storage system is provided. The method includes performing, for each block written to the system: bit-wise traversing the block, searching the block for a pattern indicating a repeating sequence of bits and, upon determining the pattern exists in the block and the repeating sequence of bits in the pattern exceeds a threshold value, removing the repeating sequence of bits from the block thereby yielding a reduced-sized block. According to aspects of the disclosure, a system for managing data block compression is provided. The system includes a memory comprising computer-executable instructions and a processor executing the computer-executable instructions, the computer-executable instructions when executed by the processor cause the processor to perform operations. The operations include performing, for each block written to the storage system: bit-wise traversing the block, searching the block for a pattern indicating a repeating sequence of bits and, upon determining the pattern exists in the block and the repeating sequence of bits in the pattern exceeds a threshold value, removing the repeating sequence of bits from the block thereby yielding a reduced-sized block.

According to aspects of the disclosure, a computer program product for managing data block compression is provided. The computer program product is embodied on a non-transitory computer readable medium, the computer program product including instructions that, when executed by a computer, causes the computer to perform operations. The operations include performing, for each block written to the storage system: bit-wise traversing the block, searching the block for a pattern indicating a repeating sequence of bits and, upon determining the pattern exists in the block and the repeating sequence of bits in the pattern exceeds a threshold value, removing the repeating sequence of bits from the block thereby yielding a reduced-sized block.

BRIEF DESCRIPTION OF THE DRAWINGS

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

DETAILED DESCRIPTION

Figure 1:
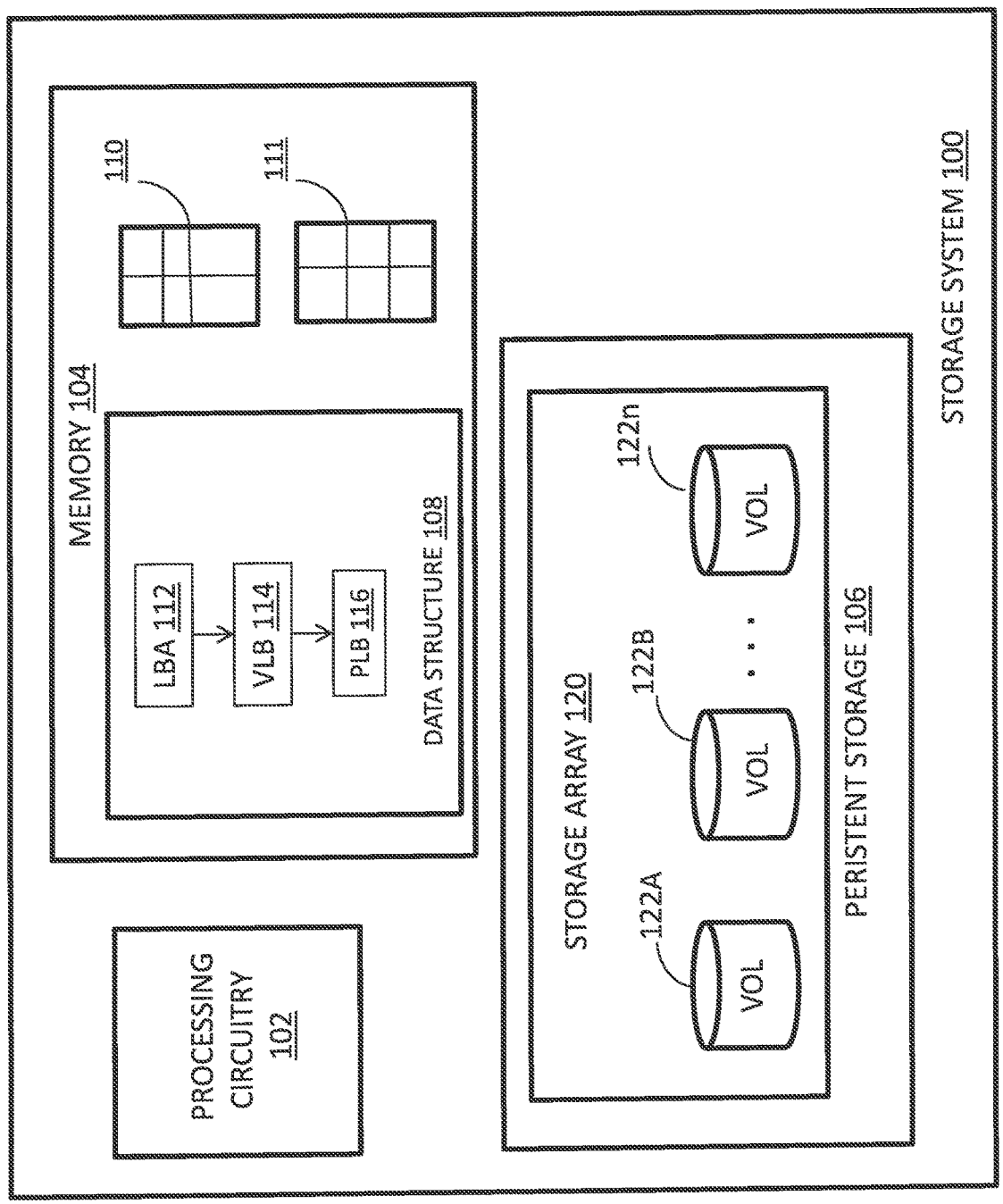
FIG. 1 is a diagram of an example of a storage system according to embodiments.

Before describing embodiments of the concepts, structures, and techniques sought to be protected herein, some terms are explained. The following description includes a number of terms for which the definitions are generally known in the art. However, the following glossary definitions are provided to clarify the subsequent description and may be helpful in understanding the specification and claims.

As used herein, the term "storage system" is intended to be broadly construed so as to encompass, for example, private or public cloud computing systems for storing data as well as systems for storing data comprising virtual infrastructure and those not comprising virtual infrastructure. As used herein, the terms "client," "host," and "user" refer, interchangeably, to any person, system, or other entity that uses a storage system to read/write data, as well as issue requests for configuration of storage units in the storage system. In some embodiments, the term "storage device" may also refer to a storage array including multiple storage devices. In certain embodiments, a storage medium may refer to one or more storage mediums such as a hard drive, a combination of hard drives, flash storage, combinations of flash storage, combinations of hard drives, flash, and other storage devices, and other types and combinations of computer readable storage mediums including those yet to be conceived. A storage medium may also refer both physical and logical storage mediums and may include multiple level of virtual to physical mappings and may be or include an image or disk image. A storage medium may be computer-readable, and may also be referred to herein as a computer-readable program medium. Also, a storage unit may refer to any unit of storage including those described above with respect to the storage devices, as well as including storage volumes, logical drives, containers, or any unit of storage exposed to a client or application. A storage volume may be a logical unit of storage that is independently identifiable and addressable by a storage system.

In certain embodiments, the term "IO request" or simply "IO" may be used to refer to an input or output request, such as a data read or data write request or a request to configure and/or update a storage unit feature. A feature may refer to any service configurable for the storage system.

In certain embodiments, a storage device may refer to any non-volatile memory (NVM) device, including hard disk drives (HDDs), solid state drivers (SSDs), flash devices (e.g., NAND flash devices), and similar devices that may be accessed locally and/or remotely (e.g., via a storage attached network (SAN)(also referred to herein as storage array network (SAN)).

In certain embodiments, a storage array (sometimes referred to as a disk array) may refer to a data storage system that is used for block-based, file-based or object storage, where storage arrays can include, for example, dedicated storage hardware that contains spinning hard disk drives (HDDs), solid-state disk drives, and/or all-flash drives. Flash, as is understood, is a solid-state (SS) random access media type that can read any address range with no latency penalty, in comparison to a hard disk drive (HDD) which has physical moving components which require relocation when reading from different address ranges and thus significantly increasing the latency for random IO data.

In certain embodiments, a data storage entity and/or storage unit may be any one or more of a file system, object storage, a virtualized device, a logical unit, a logical unit number, a logical volume, a logical device, a physical device, and/or a storage medium.

In certain embodiments, a logical unit (LU) may be a logical entity provided by a storage system for accessing data from the storage system, and as used herein a logical unit is used interchangeably with a logical volume. In many embodiments herein, a LU or LUN (logical unit number) may be used interchangeable for each other. In certain embodiments, a LUN may be a logical unit number for identifying a logical unit; may also refer to one or more virtual disks or virtual LUNs, which may correspond to one or more Virtual Machines. In certain embodiments, a volume refers to a unit of storage on a disk.

In certain embodiments, a storage cluster may refer to a type of configuration that enables stretched clusters (e.g., clusters distributed across different geographic locations). Storage cluster configurations enable entities to provide load balancing and migrations between data centers.

In certain embodiments, Log Structured Storage (LSS) refers to a file system in which data and metadata are written sequentially to a circular buffer, called a log. Log-structured file systems reclaim free space from the tail of the log to prevent the file system from becoming full when the head of the log wraps around to meet it. The tail can release space and move forward by skipping over data for which newer versions exist farther ahead in the log. If there are no newer versions, then the data is moved and appended to the head.

In certain embodiments, a block refers to a sequence of bytes or bits, having a maximum length (block size). The block size can be fixed or variable. A block device, or block storage device may refer to a level of abstraction for hardware that is responsible for storing and retrieving specified blocks of data. In certain embodiments, a file system may be based on a block device, which may be a level of abstraction for the hardware responsible for storing and retrieving specified blocks of data. Block storage may be abstracted by a file system or database management system (DBMS) for use by applications and end users. Physical or logical volumes accessed via block IO may be devices internal to a server, directly attached via SCSI or Fibre Channel, or remote devices accessed via storage area network (SAN) using protocols such as iSCSI.

While vendor-specific terminology may be used herein to facilitate understanding, it is understood that the concepts, techniques, and structures sought to be protected herein are not limited to use with any specific commercial products. In addition, to ensure clarity in the disclosure, well-understood methods, procedures, circuits, components, and products are not described in detail herein.

The phrases, "such as," "for example," "e.g.," "exemplary," and variants thereof, are used herein to describe non-limiting embodiments and are used herein to mean "serving as an example, instance, or illustration." Any embodiments herein described via these phrases and/or variants are not necessarily to be construed as preferred or advantageous over other embodiments and/or to exclude the incorporation of features from other embodiments. In addition, the word "optionally" is used herein to mean that a feature or process, etc., is provided in some embodiments and not provided in other embodiments." Any particular embodiment of the invention may include a plurality of "optional" features unless such features conflict.

Modern log structure storage systems (LSS) usually support deduplication methods to reduce physical storage capacity to enable more logical capacity for the same given physical space. Deduplication or and partial pattern removal can be performed for full page (e.g., 4K) deduplication. However, in many cases, sub-sector deduplication is not performed due to several reasons. For example, a sub-sector (which is less than 512 MB) is a very small piece of data which means that looking for such matching fragments, may require more resources in terms of metadata representation and CPU cycles than the (if at all) any benefit of such reduction. Also, compression, which is very common in storage systems, reduces further the need for sub-sector dedupe as differences between a compressed sector and a compressed partial sector may be even smaller. As such, only a technique that could enable sub-sector reduction that would consume small to little representing metadata and CPU cycles would be desirable.

Pattern matching may be used to reduce capacity (e.g., all-zero page reduction in which pages having all zeros are represented by metadata only.

A block may be compressed by removing unnecessary trailing zeros from a block. If zeros are removed from the original data, this information needs to be managed so that the original number can be rebuilt in the decompression phase without data loss. Bookkeeping for such information can be costly and may result in poor compression performance. The embodiments described herein provide a technique for partial block pattern matching and reduction that reduce total capacity and potentially reduce CPU and bus access overhead. The technique uses partial block pattern matching to remove parts of a block before ingestion operations (such as compression and hash calculation) are performed.

Turning now to FIG. 1, a system 100 for managing data block compression in a storage system environment will now be described in accordance with embodiments. The storage system 100 of FIG. 1 includes processing circuitry 102, memory 104, and persistent storage 106. In an embodiment, the persistent storage 106 may be locally installed within the storage system 100, as shown in FIG. 1, or may be an external or remote device that is communicatively coupled to the storage system 100 via a connection (not shown).

If the persistent storage 106 is remote, it may be coupled to the storage system via known connections, interfaces and network circuitry, e.g., Ethernet cables, Wireless Fidelity (Wi-Fi) wireless connections, an IP network, SCSI cables, SATA cables, Fibre Channel (FC) cables, etc. If the connection is a network connection, then interfaces and network circuitry may include, for example, one or more Ethernet cards, cellular modems, FC adapters, Wi-Fi wireless networking adapters, and/or other devices for connecting to a network. If the connection to the persistent storage is a local storage connection, then interface and/or network interface circuitry may include for example, SCSI, SAS, ATA, SATA, FC, and/or other similar controllers and ports.

The persistent storage 106 may include any kind of persistent storage devices, such as, for example, hard disk drives, solid-state storage devices, flash drives, etc. Persistent storage 106 stores user data as volumes 122A-122n, which represents one or more logical disks accessible by users. Volumes 122A-122n are organized and managed with reference to metadata that is stored within various data structures, such as metadata structure 108 in memory 104. As shown in FIG. 1, by way of non-limiting example, the persistent storage is implemented via a storage array 120. While the unit of data storage is described herein as volumes in a storage array, it is understood that other units of data storage or object storage may be employed to realize the advantages of the embodiments.

The memory 104 may be any kind of digital system memory, such as, for example, random access memory (RAM). Memory 104 stores an operating system (OS, not depicted) in operation (e.g., a Linux, UNIX, Windows, MacOS, or similar operating system). Memory 104 may also stores an input/output (I/O) stack 120 in operation (not shown). The I/O stack allows I/O requests (not depicted) from external hosts (as well as local applications) to be processed with respect to the volume data 122A-122n managed by the storage system 100.

The memory 104 also stores an index 110 for tracking metadata corresponding to blocks subject to compression, which is described further herein.

The storage system includes processing circuitry 102, which may be any kind of processor or set of processors configured to perform operations, such as, for example, a microprocessor, a multi-core microprocessor, a digital signal processor, a system on a chip, a collection of electronic circuits, a similar kind of controller, or any combination of the above. It will be understood that the storage system 100 may also include other components as are well-known in the art, including interconnection circuitry. In operation, the processing circuitry 102 may execute one or more application, which may be implemented in logic executable by the processing circuitry.

The processing circuitry 102 is configured to receive and service input/output (IO) requests from one or more external or remote systems (not shown) that are communicatively coupled to the storage system 100. The coupling may be implemented via any type of communication network, such as Internet, local area network, wide area network, and may include wireline and/or wireless technology.

The volumes 122A-122n may be addressable via a logical address that is mapped to a physical address of the array through a three level of indirection scheme that is used to perform address translation during read and write operations with respect to the array.

In deduplication processes, levels of indirection with respect to storage addressing may be used to translate or map between layers of storage space: (i) first-level mappings (leaves) that contain pointers to data, (ii) second-level mappings that contain pointers to the first-level mappings, and (iii) third-level mappings contain pointers to the second-level mappings. The first level can be logical block address space (LBA) (e.g., LBA 112), the second level can be virtual block address space (VLB) (e.g., VLB 114), and the third level can be physical address space (PLB) (e.g., PLB 116). Each of these address spaces reflect a range of addresses. The mapping can be implemented using a data structure that takes a logical address and uses a pointer to point to a VLB address, which in turn points to a physical address (PLB) in which certain data (e.g., such as a page) resides.

Deduplication may be implemented using a unique hash representing a block. The system may include a deduplication index that represents most hashes (which in turn represent most unique capacity of the cluster of volumes. A partial block match occurs when a subpage (e.g., few sectors of the page) match between two pages (e.g., part of the page are unique and part of the pages are in common).

Figure 2:
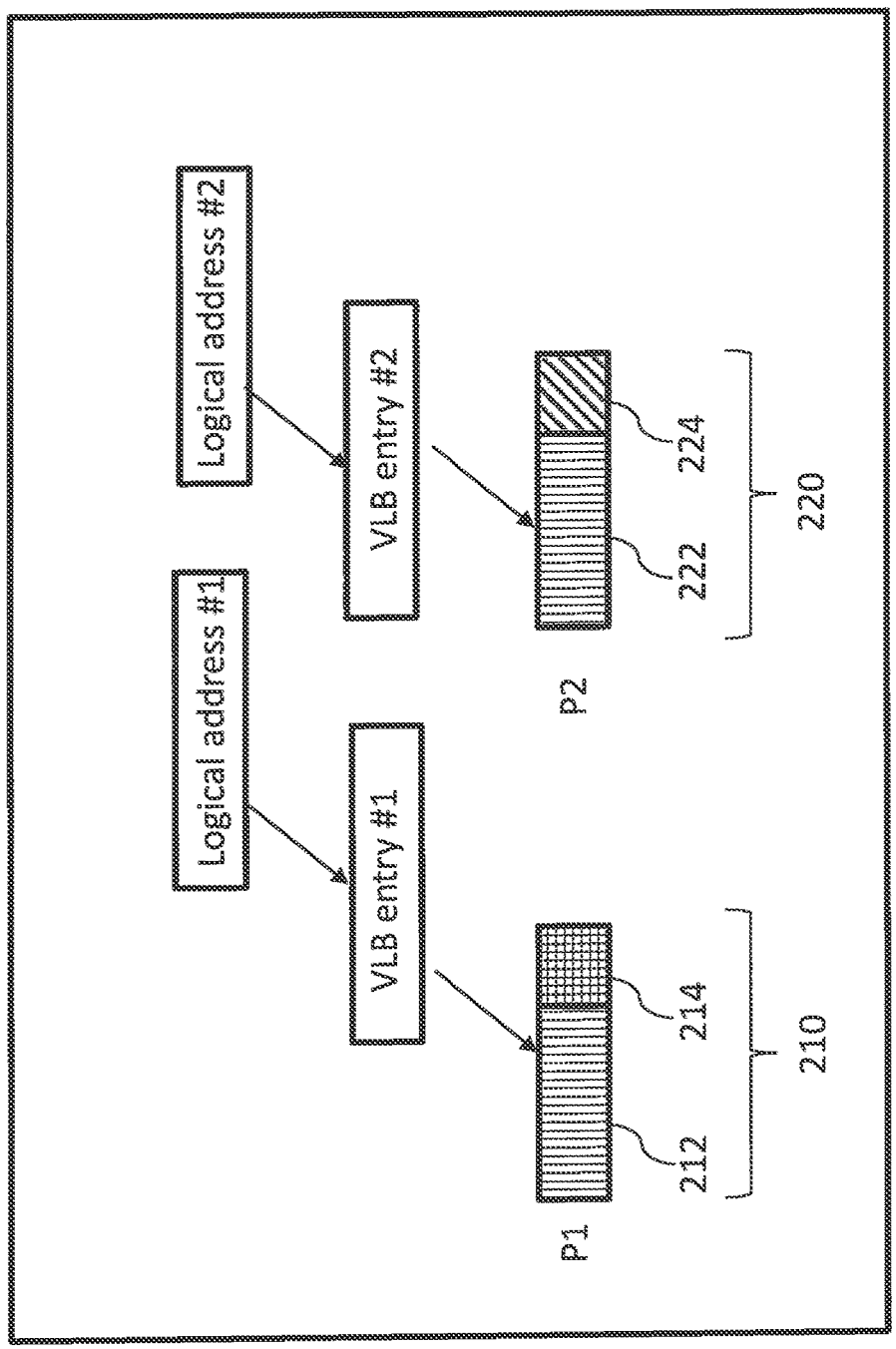
FIG. 2 is a diagram depicting an example metadata data structure.

A logical representation of metadata in a data structure 200 for two partial matching blocks (P1 and P2, 210 and 220, respectively) in a cluster is shown in FIG. 2. The data structure 200 corresponds to the data structure 108 of FIG. 1. As shown in FIG. 2, the two partial matching blocks (e.g., pages) are maintained separately of one another (i.e., no common part of the pages are maintained by the system). The common part of the pages (i.e., that which represents duplicate data) is shown as 212 and 222. The page P1 also contains data 214 which is not in common with P2. Likewise, the page P2 contains data 224 that is not in common with page P. Thus, the data stored in part of the page P1 (214) is not a duplicate of the part of the data stored in P2 (224). In the metadata structure 200 of FIG. 2, for page P1 (210), a logical address #1 for the page points to a VLB entry #1, which in turns points to the page P1. Also in the metadata structure 200 of FIG. 2, for page P2 (220), a logical address #2 for the page points to a VLB entry #2, which in turn points to the page P2.

In a block based storage system, each block is handled, e.g., when a hash representing the block is calculated, ingesting block compression for reducing the effective persisted block size, entropy calculations, and block decompression for retrieving a persistent block upon user request (e.g., a read operation). These, and other operations require access to the whole block reducing the effective block size (by elimination of patterns (e.g., trailing zeros), which may reduce CPU overhead and/or memory access overhead.

The embodiments described herein provide partial page pattern matching and reduction which results in partial page (or block) deduplication where the logical unique portion of the block is reduced. A block storage device exposes a fixed block size to an upper application (e.g., filesystem). As such, file sizes are multiples of this block size. This results with zero padding where zeros exactly fit within a full block.

In many cases trailing zeros are overlooked by storage as it's assumed that compression will eliminate (without penalty) these trailing zeros. But in some cases (e.g., software tree which composed of many small files) this is not the case and removing these trailing zero prior compression provides benefit. The embodiments described herein uses partial block pattern match to remove parts of the block prior further processing (e.g., compression). The partial block pattern matching operates to reduce (fixed) block size by marking part of the block as zeros. In terms of capacity, compressing partial blocks results in less compressed data compared with the same partial block that is padded with zeros. With respect to hardware compression bandwidth, compressing a partial block reduces the bandwidth required to the hardware compression block and as a result a) reduces bus contention and b) reduces potential additional compression when there is a bottleneck to the hardware. In addition, per page (or file) processing is reduced due the shorter effective page size. As an example, calculating page SHA-1 which may pose a high CPU load is reduced by half for a 4K page where 2 KB of it are trailing zeros.

Figure 3:
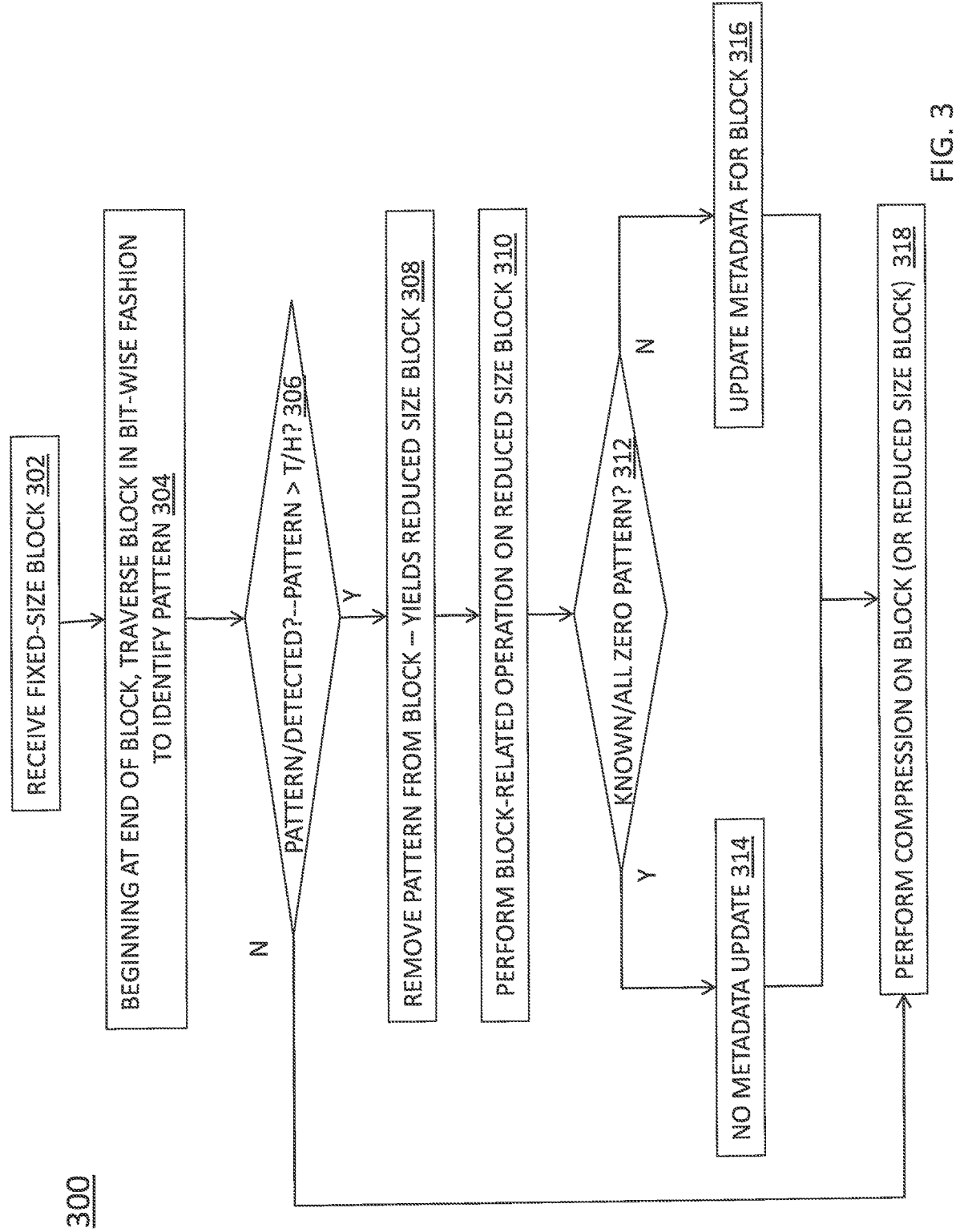
FIG. 3 is a flowchart of a process according to embodiments.
Figure 4:
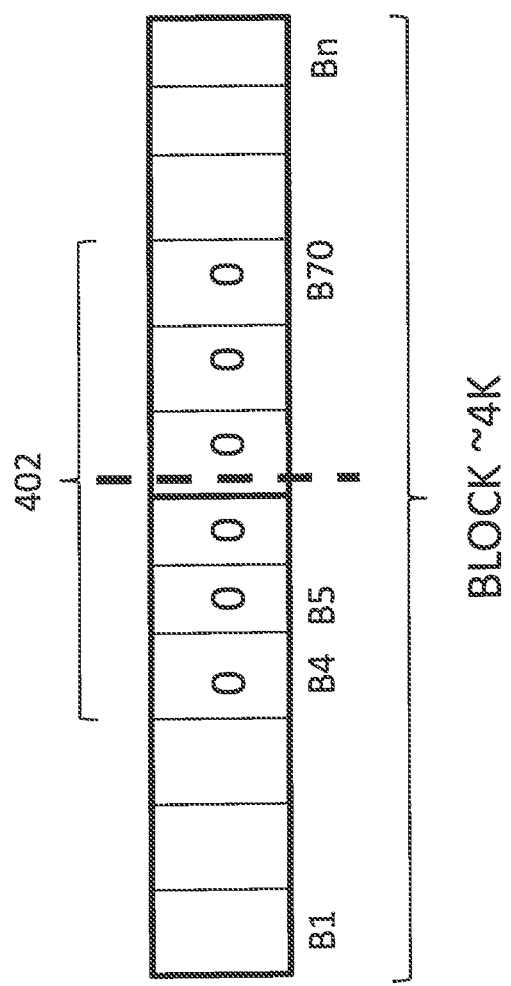
FIG. 4 is a diagram depicting an example block storage structure according to embodiments.

Turning now to FIGS. 3 and 4, a process 300 and a sample fixed-size block 400 upon which the process 300 may be performed will now be described in accordance with embodiments. Blocks 302-318 are performed for each block to be written to storage.

In block 302, the process 300 receives a block to be written to storage. In embodiments, the block is a fixed-size block as shown, e.g., in FIG. 4. In block 304, the process 300 traverses (in a bitwise fashion) the block beginning at the end of the block (e.g., in which the newest data has been entered). During this traversal, the process 300 looks for any patterns in the data referred to as a repeating sequence of bits. The pattern can be a repeating data value, such as trailing zeros at the end of the block or may be any repeating sequence of data in any mid-portion of the block. A non-zero repeating sequence may include, e.g., a pattern of repeating 1, 2, 3, 4 . . . or 2, 2, 2, 2 . . . , to name a few. By beginning the traversal at the end of the block as described above, the identification of a non-zero pattern is detected early (e.g., padded zeros added at the end of the block).

In block 306, the process 300 determines if there is a detected pattern and if so, if the pattern exceeds a threshold value (e.g., a minimum number of repeating bits or trailing zeros). FIG. 4 illustrates an example pattern 402 in the block 400 that has been identified by a number of bits in a repeating sequence. The threshold value may be selected as a function of the size of the pattern of bits in relation to the size of the block. By way of non-limiting example, a threshold may be set as a pattern of bits that exceeds 10% of the size of the block.

If there is no pattern, or alternatively, if the pattern does not exceed the threshold value, a compression operation is performed on the block in block 318.

If, however, there is a pattern detected that exceeds the threshold value in block 306, the process 300 removes the bits corresponding to the pattern (i.e., the repeating sequence of bits) from the block, thereby yielding a reduced size block in block 308. Using the above example, the reduced block size is approximately 10% smaller than the original block size. It is understood that the removal of a repeating sequence can be within the block (i.e., not limited to a trailing sequence).

The removal of the portion of the block subject to the pattern, e.g., removal of trailing zeros, can be performed in chunks of 64 bytes. As such, marking a number, e.g., 2K, of the pattern is efficient since only a few bits are needed to represent a repeating sequence. This can sum to a few bits to represent, e.g., 3.5K of repeating bits.

In block 310, the process 300 performs a block operation on the reduced size block. For example, a hash calculation may be performed on the reduced size block. This hash calculation may utilize fewer resources (e.g., CPU cycles) and fewer bus operations due to the reduced size of the block as there is less data for the hash calculation.

In block 312, it is determined whether the detected pattern is a common pattern, such as all trailing zeros. If so, no update to the metadata for the block is required in block 314, as blocks are padded to the predefined length of the block. Otherwise, if a known or all zero pattern is detected, metadata for the block is updated (e.g., in the hash table 110 of FIG. 1) in block 316. It will be understood that the ability to avoid updates of metadata or to update metadata at a less frequent interval can save storage space and reduce CPU cycle time.

In block 318, a compression operation is performed on the block. The compression operation may utilize fewer resources as compared to traditional compression operations as the block has been reduced in size through the process of FIG. 3.

It will be understood that the advantages described above with respect to block-related operations performed on blocks and the compression operations on reduced size blocks can be extended to decompression operations as well since less CPU cycles and bus access is required to decompress the compressed blocks.

An example of the compression/decompression bandwidth that may be gained is described below:

Assuming a 20 GB/s compression engine bandwidth hardware, when considering an average file size of 1 KB, the following capabilities result:

Without a trailing zero removal, the process can compress 4K blocks–>20 GB/4 KB=5M block/sec;

With trailing zeros removal, the process needs to compress only part of the block, each at 1 KB–>20 GB/1 KB=20M blocks/sec depending on the compression bottleneck (bandwidth or processing).

As can be seen, 4 times more blocks/sec can be compressed by simply removing the trailing zeros.

A software example is valid also where CPU cycles are reduced in compressing less bytes. The same may apply for hash calculations.

In an embodiment, if the pattern includes a number of bits in the block that is less than a predefined value (e.g., <1K), compression may be performed on a partial page that includes only the bits having the pattern. If the number of bits in the pattern are equal to or exceed the value, traditional compression may be performed on the block.

Figure 5:
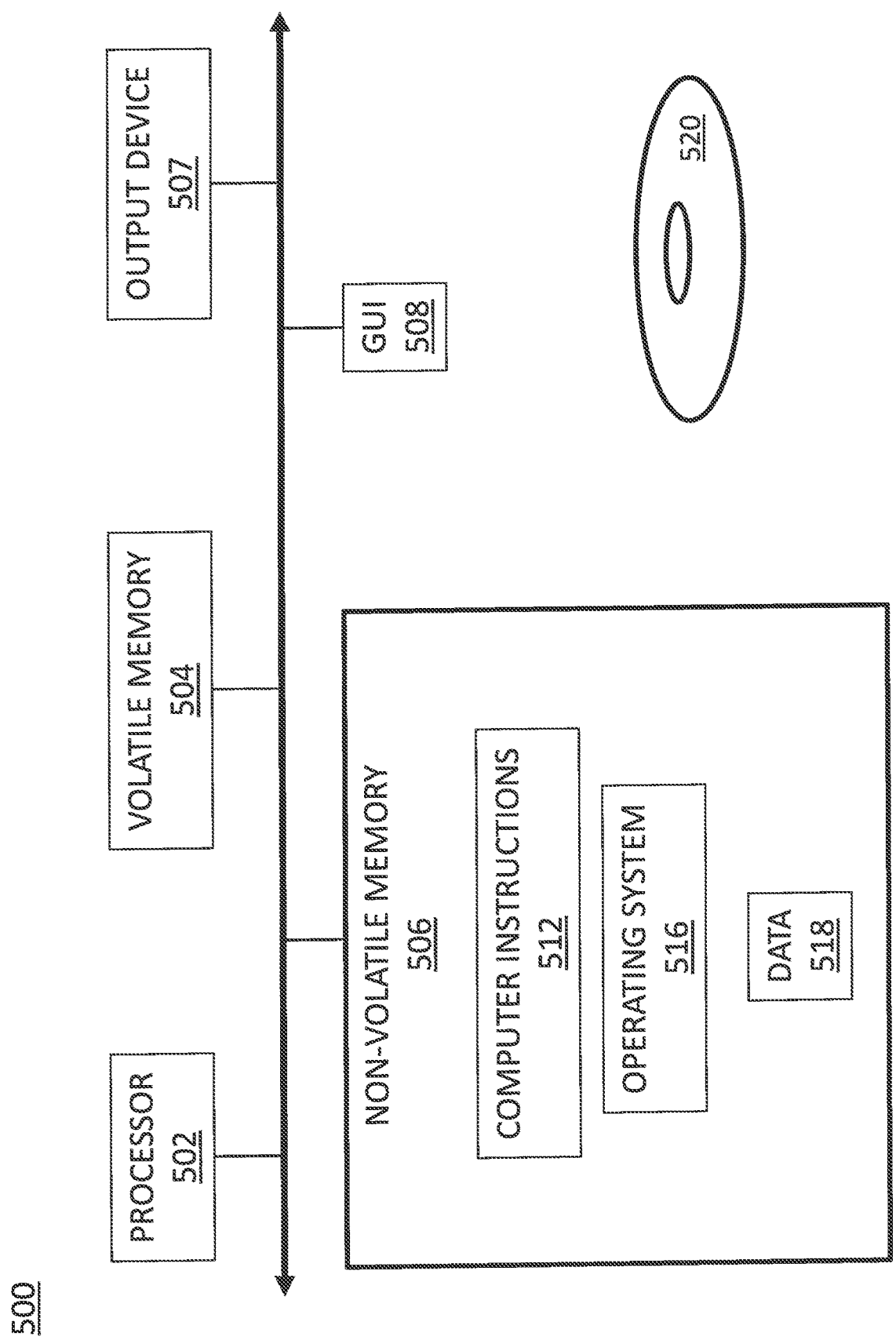
FIG. 5 is a diagram of an example of a computing device according to embodiments.

FIG. 5 shows an exemplary computer 500 (e.g., physical or virtual) that can perform at least part of the processing described herein. The computer 500 includes a processor 502, a volatile memory 504, a non-volatile memory 506 (e.g., hard disk or flash), an output device 507 and a graphical user interface (GUI) 508 (e.g., a mouse, a keyboard, a display, for example). The non-volatile memory 506 stores computer instructions 512, an operating system 516 and data 518. In one example, the computer instructions 512 are executed by the processor 502 out of volatile memory 504. In one embodiment, an article 520 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to the disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

The invention claimed is:

1. A method for managing data block compression in a storage system, the method comprising:
   performing, for each block written to the storage system:
   bit-wise traversing the block;
   searching the block, responsive to the traversing, for a pattern indicating a repeating sequence of bits;
   upon determining the pattern exists in the block and the repeating sequence of bits in the pattern exceeds a threshold value, removing the repeating sequence of bits from the block thereby yielding a reduced-size block;
   upon determining the pattern is not a trailing set of zeros in the block, updating corresponding metadata for the reduced-size block; and
   upon determining the pattern is a trailing set of zeros in the block, performing no update to corresponding metadata for the reduced-size block.

2. The method of claim 1, further comprising:
   performing a compression operation on the reduced-size block.

3. The method of claim 2, further comprising:
   performing a block operation on the reduced-size block prior to the compression operation.

4. The method of claim 3, wherein the block operation is a hash calculation.

5. The method of claim 2, wherein upon determining the pattern exists in the block and the repeating sequence of bits does not exceed a threshold value, performing the compression operation on the block.

6. The method of claim 1, wherein bit-wise traversing the block includes bit-wise traversing the block from an end of the block having a most recent entry.

7. A system for managing data block compression in a storage system, the system comprising:
   a memory comprising computer-executable instructions; and
   a processor executing the computer-executable instructions, the computer-executable instructions when executed by the processor cause the processor to perform operations comprising:
   performing, for each block written to the storage system:
   bit-wise traversing the block;
   searching the block, responsive to the traversing, for a pattern indicating a repeating sequence of bits;
   upon determining the pattern exists in the block and the repeating sequence of bits in the pattern exceeds a threshold value, removing the repeating sequence of bits from the block thereby yielding a reduced-size block;
   upon determining the pattern is not a trailing set of zeros in the block, updating corresponding metadata for the reduced-size block; and
   upon determining the pattern is a trailing set of zeros in the block, performing no update to corresponding metadata for the reduced-size block.

8. The system of claim 7, wherein the operations further comprise:
   performing a compression operation on the reduced-size block.

9. The system of claim 8, wherein the operations further comprise performing a block operation on the reduced-size block prior to the compression operation.

10. The system of claim 9, wherein the block operation is a hash calculation.

11. The system of claim 8, wherein upon determining the pattern exists in the block and the repeating sequence of bits does not exceed a threshold value, performing the compression operation on the block.

12. The system of claim 7, wherein bit-wise traversing the block includes bit-wise traversing the block from an end of the block having a most recent entry.

13. A computer program product for managing data block compression in a storage system, the computer program product embodied on a non-transitory computer readable medium, and the computer program product including instructions that, when executed by a computer, causes the computer to perform for each block written to the storage system, operations of:
   bit-wise traversing the block;
   searching the block, responsive to the traversing, for a pattern indicating a repeating sequence of bits;
   upon determining the pattern exists in the block and the repeating sequence of bits in the pattern exceeds a threshold value, removing the repeating sequence of bits from the block thereby yielding a reduced-size block;
   upon determining the pattern is not a trailing set of zeros in the block, updating corresponding metadata for the reduced-size block; and
   upon determining the pattern is a trailing set of zeros in the block, performing no update to corresponding metadata for the reduced-size block.

14. The computer program product of claim 13, wherein the operations further comprise:
   performing a compression operation on the reduced-size block.

15. The computer program product of claim 14, wherein the operations further comprise performing a block operation on the reduced-size block prior to the compression operation, the block operation including a hash calculation.

16. The computer program product of claim 14, wherein upon determining the pattern exists in the block and the repeating sequence of bits does not exceed a threshold value, performing the compression operation on the block.

17. The computer program product of claim 13, wherein bit-wise traversing the block includes bit-wise traversing the block from an end of the block having a most recent entry.

\* \* \* \* \*